United States Patent
Lee (10) Patent No.: US 8,274,318 B2
(45) Date of Patent: Sep. 25, 2012

(54) DUTY CYCLE CORRECTION CIRCUIT OF SEMICONDUCTOR MEMORY APPARATUS

(75) Inventor: Hye Young Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 96 days.

(21) Appl. No.: 12/970,931

(22) Filed: Dec. 16, 2010

(65) Prior Publication Data

US 2012/0105122 A1    May 3, 2012

(30) Foreign Application Priority Data

Oct. 29, 2010    (KR) .................. 10-2010-0106906

(51) Int. Cl.
H03K 5/04    (2006.01)
(52) U.S. Cl. ........................ 327/175; 327/172
(58) Field of Classification Search ............ 327/35, 327/172–175
See application file for complete search history.

(56) References Cited

U.S. PATENT DOCUMENTS

| 7,015,739 | B2 | 3/2006 | Lee et al. |
| 7,180,346 | B2 * | 2/2007 | Lee ........................ 327/175 |
| 7,183,791 | B2 | 2/2007 | Walker et al. |
| 7,307,461 | B2 * | 12/2007 | Nguyen et al. ............ 327/172 |
| 2004/0189364 | A1 | 9/2004 | Lee et al. |
| 2005/0285649 | A1 | 12/2005 | Chun et al. |
| 2006/0028256 | A1 | 2/2006 | Nam et al. |
| 2007/0159224 | A1 | 7/2007 | Dwarka et al. |
| 2012/0007647 | A1 * | 1/2012 | Shim et al. ............... 327/175 |

FOREIGN PATENT DOCUMENTS

| JP | 2004-187200 | 7/2004 |
| JP | 2007-174669 | 7/2007 |
| KR | 10-0933805 B1 | 12/2009 |
| KR | 10-2010-0073427 A | 7/2010 |

* cited by examiner

Primary Examiner — An Luu
(74) Attorney, Agent, or Firm — William Park & Associates Ltd.

(57) ABSTRACT

A duty cycle correction circuit of a semiconductor memory apparatus includes a duty correction unit configured to determine a duty correction range in response to a duty correction range control signal, correct a duty of an inputted clock in response to duty correction codes to fall in the determined duty correction range, and generate a duty corrected clock; a duty detection unit configured to detect a duty of the duty corrected clock and output duty information; and a duty correction code generation unit configured to generate the duty correction codes based on the duty information.

43 Claims, 5 Drawing Sheets

DUTY CYCLE CORRECTION CIRCUIT OF SEMICONDUCTOR MEMORY APPARATUS

CROSS-REFERENCES TO RELATED APPLICATION

The present application claims priority under 35 U.S.C. §119(a) to Korean Application No. 10-2010-0106906, filed on Oct. 21, 2010, in the Korean Intellectual Property Office, which is incorporated herein by reference in its entirety as if set forth in full.

BACKGROUND

1. Technical Field

The present invention relates to a semiconductor integrated circuit, and more particularly, to a duty cycle correction circuit used in a semiconductor memory apparatus.

2. Related Art

A semiconductor memory apparatus receives a clock from an outside and operates in synchronization with the inputted clock. If the duty of the clock inputted from the outside is inaccurate, it is difficult for the semiconductor memory apparatus to operate normally. Thus, in order to prevent a situation where the duty of the clock inputted from the outside becomes inaccurate, a circuit for correcting the duty of the clock is designed and used in the semiconductor memory apparatus. In general, the circuit for correcting the duty of the clock in the semiconductor memory apparatus is called a duty cycle correction circuit.

As a semiconductor memory apparatus operates at a high speed, a high frequency external clock is inputted. In this regard, in order to ensure the stable operation of the semiconductor memory apparatus operating at a high speed, it is necessary to secure operational stability of a duty cycle correction circuit for correcting the duty ratio of the clock. Also, in order to accommodate the trend toward low power consumption and high areal efficiency of a semiconductor memory apparatus, a duty cycle correction circuit capable of reducing power consumption and having improved areal efficiency has been demanded in the art.

SUMMARY

A duty cycle correction circuit of a semiconductor memory apparatus which can ensure a stable duty correction operation even is in the case of a clock with a high frequency, reduce power consumption and improve areal efficiency is described herein.

In one embodiment of the present invention, a duty cycle correction circuit of a semiconductor memory apparatus includes: a duty correction unit configured to determine a duty correction range in response to a duty correction range control signal, correct a duty of an inputted clock in response to duty correction codes to fall in the determined duty correction range, and generate a duty corrected clock; a duty detection unit configured to detect a duty of the duty corrected clock and output duty information; and a duty correction code generation unit configured to generate the duty correction codes based on the duty information.

In another embodiment of the present invention, a duty cycle correction circuit of a semiconductor memory apparatus includes: a duty detection unit configured to detect a duty of a duty corrected clock and enable a first duty detection signal or a second duty detection signal; a duty correction code generation unit configured to increase and decrease a code value of duty correction codes in response to the first and second duty detection signals; and a duty correction unit configured to generate a delayed clock by delaying a clock, transfer a first pull-up driving force and a first pull-down driving force for determining a voltage level of a common node to the common node in response to the clock and the duty correction codes, transfer a second pull-up driving force and a second pull-down driving force for determining a voltage level of the common node to the common node in response to the delayed clock and the duty correction codes, and generate the duty corrected clock by driving a voltage of the common node.

In another embodiment of the present invention, a duty cycle correction circuit of a semiconductor memory apparatus includes: a duty correction range setting section configured to delay a clock and generate a delayed clock; a common node voltage determination section configured to determine a voltage level of a common node in response to one of a pull-up driving force and a pull-down driving force when phases of the clock and the delayed clock are the same with each other, and determine the voltage level of the common node in response to both the pull-up driving force and the pull-down driving force based on duty correction codes when the phases of the clock and the delayed clock are different from each other; and a driver configured to drive the voltage level of the common node and output a duty corrected clock.

BRIEF DESCRIPTION OF THE DRAWINGS

Features, aspects, and embodiments are described in conjunction with the attached drawings, in which.

DETAILED DESCRIPTION

Hereinafter, a duty cycle correction circuit of a semiconductor memory apparatus according to the present invention will be described below with reference to the accompanying drawings through exemplary embodiments.

Figure 1:
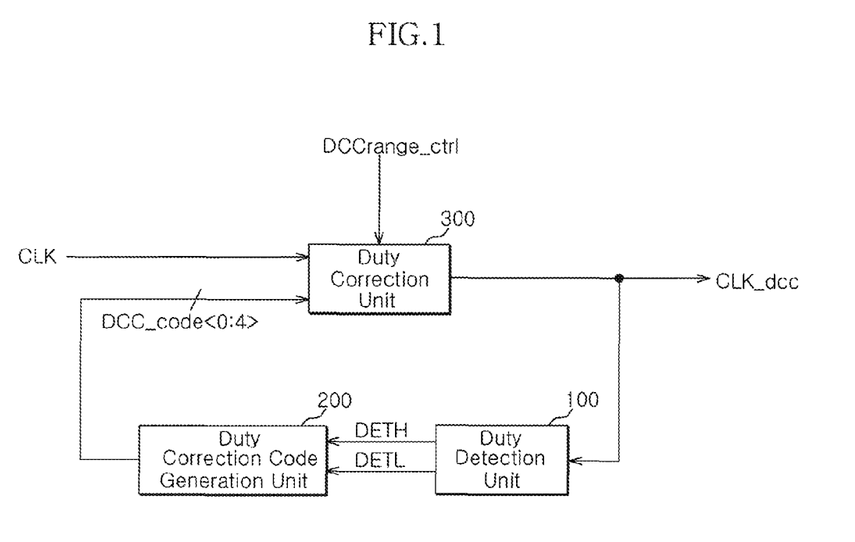
FIG. 1 is a configuration diagram schematically illustrating a duty cycle correction circuit of a semiconductor memory apparatus in accordance with an embodiment of the present invention.

FIG. 1 is a configuration diagram schematically illustrating a duty cycle correction circuit of a semiconductor memory apparatus in accordance with an embodiment of the present invention. Referring to FIG. 1, a duty cycle correction circuit of a semiconductor memory apparatus in accordance with one embodiment of the present invention includes a duty detection unit 100, a duty correction code generation unit 200, and a duty correction unit 300.

The duty detection unit 100 is configured to detect the duty of a duty corrected clock CLK_dcc and output duty information DETH and DETL. The duty information DETH and DETL includes a first duty detection signal DETH and a second duty detection signal DETL. For example, the duty detection unit 100 enables the first duty detection signal DETH when, between the high level duration and the low level duration of the duty corrected clock CLK_dcc, the high level duration is longer than the low level duration. On the other hand, the duty detection unit 100 enables the second duty detection signal DETL when, between the high level duration and the low level duration of the duty corrected clock CLK_dcc, the low level duration is longer than the high level duration.

The duty correction code generation unit 200 is configured to generate duty correction codes DCC_code<0:4> based on the duty information DETH and DETL. In other words, the duty correction code generation unit 200 increases or decreases the code value of the duty correction codes DCC_code<0:4> in response to the duty information DETH and DETL. For example, if information that, between the high level duration and the low level duration of the duty corrected clock CLK_dcc, the low level duration is longer than the high level duration is inputted, that is, if the second duty detection signal DETL is enabled, the duty correction code generation unit 200 increases the code value of the duty correction codes DCC_code<0:4>. Also, if information that the high level duration of the duty corrected clock CLK_dcc is longer than the low level duration of the duty corrected clock CLK_dcc is inputted, that is, if the first duty detection signal DETH is enabled, the duty correction code generation unit 200 decreases the code value of the duty correction is codes DCC_code<0:4>.

The duty correction unit 300 is configured to determine a duty correction range in response to a duty correction range control signal DCCrange_ctrl, correct the duty of an inputted clock CLK to fall in the determined duty correction range based on the duty correction codes DCC_code<0:4>, and generate the duty corrected clock CLK_dcc.

Figure 2:
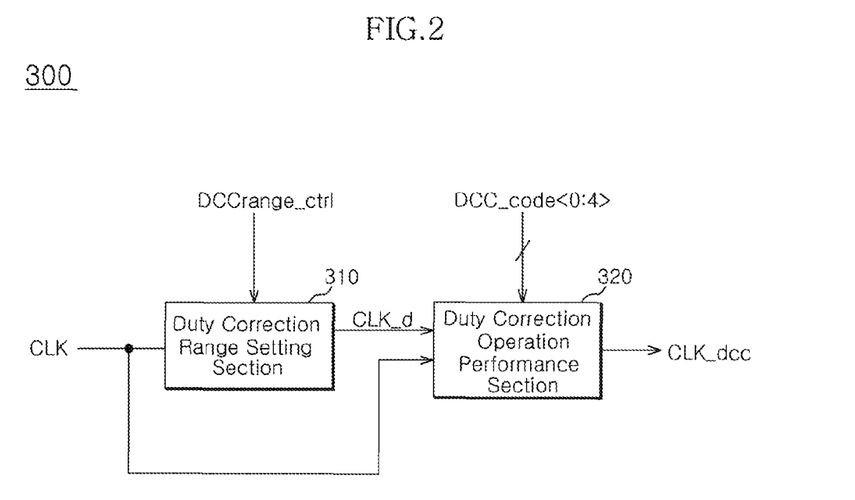
FIG. 2 is a configuration diagram schematically illustrating the duty correction unit shown in FIG. 1.

FIG. 2 is a configuration diagram schematically illustrating the duty correction unit shown in FIG. 1. Referring to FIG. 2, the duty correction unit 300 includes a duty correction range setting section 310 and a duty correction operation performance section 320.

The duty correction range setting section 310 is configured to determine the duty correction range in response to the duty correction range control signal DCCrange_ctrl. For example, the duty correction range setting section 310 determines a delay time in response to the duty correction range control signal DCCrange_ctrl, delay the clock CLK by the predetermined delay time, and generate a delayed clock CLK_d.

The duty correction operation performance section 320 is configured to correct the duty of the inputted clock CLK to fall in the determined duty correction range based on the duty correction codes DCC_code<0:4> and generate the duty corrected clock CLK_dcc. For example, the duty correction operation performance section 320 generates the duty corrected clock CLK_dcc which transitions between the transition timings of the clock CLK and the delayed clock CLK_d, based on the duty correction codes DCC_code<0:4>. That is to say, the duty correction operation performance section 320 generates the duty corrected clock CLK_dcc which has a rising edge between the rising edge of the clock CLK and the rising edge of the delayed clock CLK_d based on the duty correction codes DCC_code<0:4> and a falling edge between the falling edge of the clock CLK and the falling edge of the delayed clock CLK_d based on the duty correction codes DCC_code<0:4>.

Figure 3:
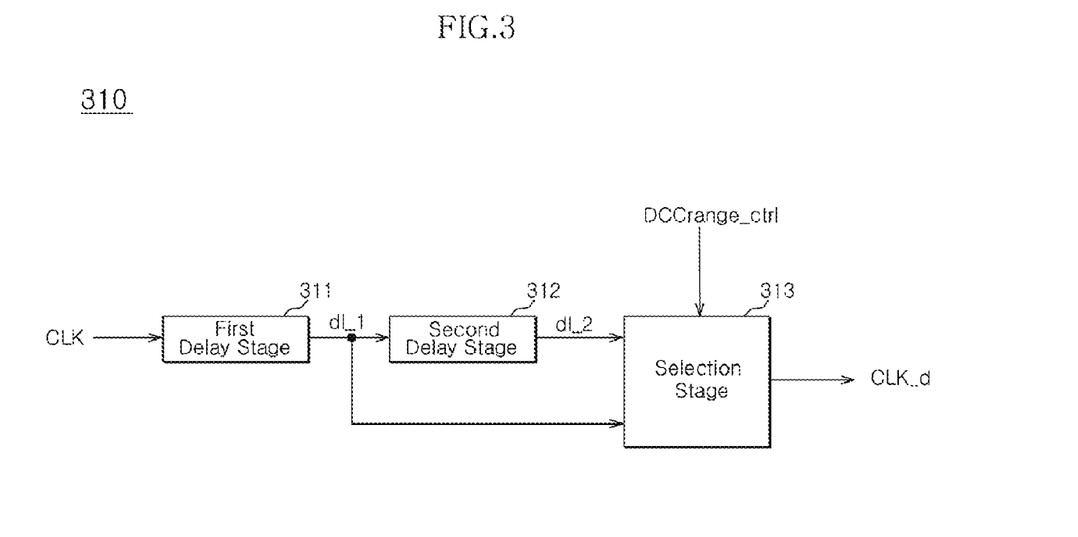
FIG. 3 is a configuration diagram schematically illustrating the duty correction range setting section shown in FIG. 2.

FIG. 3 is a configuration diagram schematically illustrating the duty correction range setting section shown in FIG. 2.

Referring to FIG. 3, the duty correction range setting section 310 includes a first delay stage 311, a second delay stage 312 and a selection stage 313.

The first delay stage 311 is configured to delay the clock CLK and generate a first delayed signal dl_1.

The second delay stage 312 is configured to delay the first delayed signal dl_1 and generate a second delayed signal dl_2.

The selection stage 313 is configured to select one of the first delayed signal dl_1 and the second delayed signal dl_2 in response to the duty correction range control signal DCCrange_ctrl and output the selected signal as the delayed clock CLK_d. The selection stage 313 may be realized as a multiplexer. FIG. 3 shows an embodiment of the duty correction range setting section 310. In this regard, a person skilled in the art can readily appreciate that the duty correction range setting section 310 may be configured in such a is manner that a plurality of delay stages are coupled in series and one of the output signals of the respective delay stages is outputted as the delayed clock CLK_d based on the duty correction codes DCC_code<0:4>.

Figure 4:
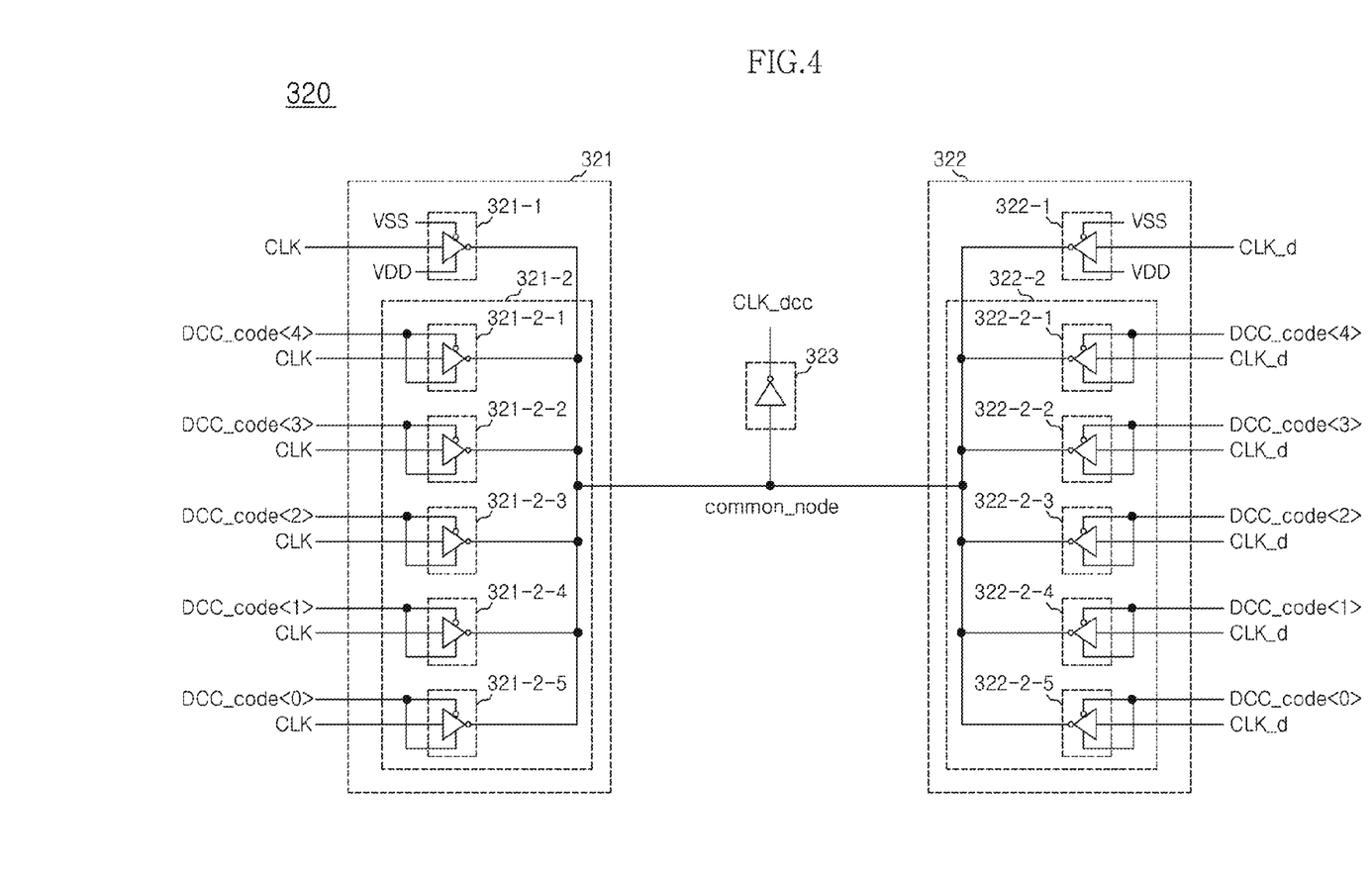
FIG. 4 is a configuration diagram schematically illustrating the duty correction operation performance section shown in FIG. 2.

FIG. 4 is a configuration diagram schematically illustrating the duty correction operation performance section shown in FIG. 2. Referring to FIG. 4, the duty correction operation performance section 320 includes a first common node driving stage 321, a second common node driving stage 322, and a driver 323.

The first common node driving stage 321 is configured to transfer a first pull-up driving force and a first pull-down driving force for driving a common node common_node to the common node common_node based on the duty correction codes DCC_code<0:4> and the clock CLK. For example, the first common node driving stage 321 determines the magnitudes of the first pull-down driving force and the first pull-up driving force based on the duty correction codes DCC_code<0:4>, select the first pull-down driving force or the first pull-up driving force in response to the level of the clock CLK, and transfers the selected driving force to the common node common_node. Describing in detail, the first common node driving stage 321 determines the magnitudes of the first pull-down driving force and the first pull-up driving force based on the duty correction codes DCC_code<0:4>, and transfers the first pull-down driving force to the common node common_node when the clock CLK has a high level. The first common node driving stage 321 transfers the first is pull-up driving force determined in the magnitude thereof to the common node common_node when the clock CLK has a low level. If the first pull-down driving force increases based on the code value of the duty correction codes DCC_code<0:4>, the first pull-up driving force decreases, and if the first pull-down driving force decreases based on the code value of the duty correction codes DCC_code<0:4>, the first pull-up driving force increases.

The first common node driving stage 321 includes a first fixed driving part 321-1 and a first variable driving part 321-2.

The first fixed driving part 321-1 is configured to drive the common node common_node in response to the clock CLK regardless of the duty correction codes DCC_code<0:4>.

The first variable driving part 321-2 is configured to drive the common node common_node based on the duty correction codes DCC_code<0:4> and the clock CLK.

The first variable driving part 321-2 includes first through fifth variable unit driving parts 321-2-1 through 321-2-5 which receive the respective bits of the duty correction codes DCC_code<0:4> and the clock CLK. The respective output terminals of the first through fifth variable unit driving parts 321-2-1 through 321-2-5 are coupled to the common node common_node.

Each of the first through fifth variable unit driving parts 321-2-1 through 321-2-5 drives the common node common_node when the level of a bit inputted among the duty correction codes DCC_code<0:4> and the level of the clock CLK are the same with each other. For example, each of the first through fifth variable unit driving parts 321-2-1 through 321-2-5 transfers the first pull-down driving force to the common node common_node when the bit inputted among the duty correction codes DCC_code<0:4> has a high level and the clock CLK has the high level, and transfers the first pull-up driving force to the common node common_node when the bit inputted among the duty correction codes DCC_code<0:4> has a low level and the clock CLK has the low level.

The second common node driving stage 322 is configured to transfer a second pull-up driving force and a second pull-down driving force for driving the common node common_node to the common node common_node based on the duty correction codes DCC_code<0:4> and the delayed clock CLK_d. For example, the second common node driving stage 322 determines the magnitudes of the second pull-down driving force and the second pull-up driving force based on the duty correction codes DCC_code<0:4>, select the second pull-down driving force or the second pull-up driving force in response to the level of the delayed clock CLK_d, and transfers the selected driving force to the common node common_node. Describing in detail, the second common node driving stage 322 determines the magnitudes of the second pull-down driving force and the second pull-up driving force based on the duty correction codes DCC_code<0:4>, and transfers the second pull-down driving force to the common node common_node when the delayed clock CLK_d has a high level. The second common node driving stage 322 transfers the second pull-up driving force determined in the magnitude thereof to the common node common_node when the delayed clock CLK_d has a low level. If the second pull-down driving force increases based on the code value of the duty correction codes DCC_code<0:4>, the second pull-up driving force decreases, and if the second pull-down driving force decreases based on the code value of the duty correction codes DCC_code<0:4>, the second pull-up driving force increases.

The second common node driving stage 322 includes a second fixed driving part 322-1 and a second variable driving part 322-2.

The second fixed driving part 322-1 is configured to drive the common node common_node in response to the delayed clock CLK_d regardless of the duty correction codes DCC_code<0:4>.

The second variable driving part 322-2 is configured to drive the common node common_node based on the duty correction codes DCC_code<0:4> and the delayed clock CLK_d.

The second variable driving part 322-2 includes sixth through tenth variable unit driving parts 322-2-1 through 322-2-5 which receive the respective bits of the duty correction codes DCC_code<0:4> and the delayed clock CLK_d. The respective output terminals of the sixth through tenth variable unit driving parts 322-2-1 through 322-2-5 are coupled to the common node common_node.

Each of the sixth through tenth variable unit driving parts 322-2-1 through 322-2-5 drives the common node common_node is when the level of a bit inputted among the duty correction codes DCC_code<0:4> and the level of the delayed clock CLK_d are the same with each other. For example, each of the sixth through tenth variable unit driving parts 322-2-1 through 322-2-5 transfers the second pull-down driving force to the common node common_node when the bit inputted among the duty correction codes DCC_code<0:4> has a high level and the delayed clock CLK_d has the high level, and transfers the second pull-up driving force to the common node common_node when the bit inputted among the duty correction codes DCC_code<0:4> has a low level and the delayed clock CLK_d has the low level.

The first and second fixed driving parts 321-1 and 322-1 and the first through tenth variable unit driving parts 321-2-1 through 321-2-5 and 322-2-1 through 322-2-5 have the same configuration with different input signals.

Since the first and second fixed driving parts 321-1 and 322-1 and the first through tenth variable unit driving parts 321-2-1 through 321-2-5 and 322-2-1 through 322-2-5 are configured in the same way, only the configuration of the first fixed driving part 321-1 will be described below.

Figure 5:
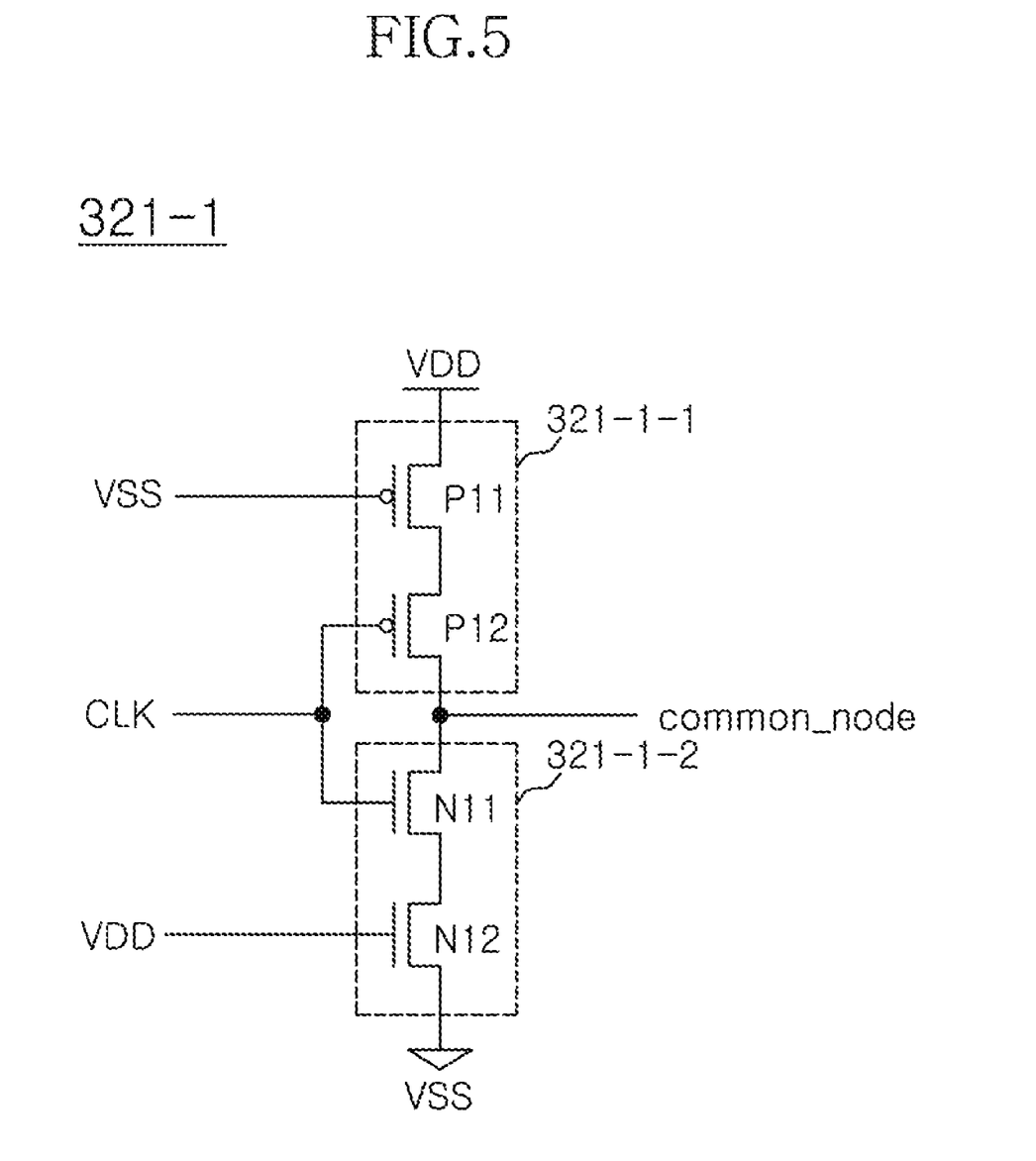
FIG. 5 is a configuration diagram schematically illustrating the fixed driving part shown in FIG. 4.

FIG. 5 is a configuration diagram schematically illustrating the fixed driving part shown in FIG. 4. Referring to FIG. 5, the first fixed driving part 321-1 includes a pull-up driving element 321-1-1 and a pull-down driving element 321-1-2.

The pull-up driving element 321-1-1 includes first and second transistors P11 and P12. The first transistor P11 has a gate to which a ground terminal VSS is coupled and a source which receives an external voltage VDD. The second transistor P12 has a gate which receives the clock CLK, a source to which the drain of the first transistor P11 is coupled, and a drain to which the common node common_node is coupled. The pull-up driving element 321-1-1 configured in this way transfers the external voltage VDD to the common node common_node when the clock CLK has the low level. Meanwhile, since each of the pull-up driving elements of the first through fifth variable unit driving parts 321-2-1 through 321-2-5 receives one bit among the duty correction codes DCC_code<0:4> instead of being coupled by the ground terminal VSS, each of the first through fifth variable unit driving parts 321-2-1 through 321-2-5 performs a pull-up operation of transferring the external voltage VDD to the common node common_node so as to raise the voltage level of the common node common_node when the one bit inputted among the duty correction codes DCC_code<0:4> has the low level and the clock CLK has the low level. Also, each of the sixth through tenth variable unit driving parts 322-2-1 through 322-2-5 performs a pull-up operation of transferring the external voltage VDD to the common node common_node so as to raise the voltage level of the common node common_node when the one bit inputted among the duty correction codes DCC_code<0:4> has the low level and the delayed clock CLK_d has the low level.

The pull-down driving element 321-1-2 includes third and fourth transistors N11 and N12. The third transistor N11 has a gate to which the clock CLK is inputted and a drain to which the common node common_node is coupled. The fourth transistor N12 has a gate to which the external voltage VDD is applied, a drain to which the source of the third transistor N11 is coupled, and a source to which the ground terminal VSS is coupled. The pull-down driving element 321-1-2 configured in this way transfers the external voltage VDD to the common node common_node when the clock CLK has the high level. Meanwhile, since each of the pull-down driving elements of the first through fifth variable unit driving parts 321-2-1 through 321-2-5 receives one bit among the duty correction codes DCC_code<0:4> instead of the external voltage VDD, each of the first through fifth variable unit driving parts 321-2-1 through 321-2-5 performs a pull-down operation of flowing the current of the common node common_node to the ground terminal VSS so as to lower the voltage level of the common node common_node when the one bit inputted among the duty correction codes DCC_code<0:4> has the high level and the clock CLK has the high level. Also, each of the sixth through tenth variable unit driving parts 322-2-1 through 322-2-5 performs a pull-up operation of flowing current of the common node common_node to the ground terminal VSS so as to lower the voltage level of the common node common_node when the one bit inputted among the duty correction codes DCC_code<0:4> has the high level and the delayed clock CLK_d has the high level.

The pull-up driving element and the pull-down driving element which constitute each of the first through tenth variable unit driving parts 321-2-1 through 321-2-5 commonly receive one bit of the duty correction codes DCC_code<0:4>.

The driver 323 is configured to drive the voltage of the common node common_node and output the duty corrected clock CLK_dcc.

Operations of the duty cycle correction circuit of a semiconductor memory apparatus in accordance with the embodiment of the present invention, configured as mentioned above, will be described below.

Referring to FIG. 1, the duty detection unit 100 checks the duty of the duty corrected clock CLK_dcc, that is, compares the lengths of the high level duration and the low level duration of the duty corrected clock CLK_dcc, and enables the first duty detection signal DETH when the high level duration is longer than the low level duration. Meanwhile, the duty detection unit 100 enables the second duty detection signal DETL when the low level duration is longer than the high level duration.

The duty correction code generation unit 200 generates the duty correction codes DCC_code<0:4> in response to the first and second duty detection signals DETH and DETL.

The duty correction unit 300 corrects the duty of the clock CLK based on the duty correction codes DCC_code<0:4> and outputs the corrected clock CLK as the duty corrected clock CLK_dcc. The duty correction unit 300 outputs the duty corrected clock CLK_dcc by increasing or decreasing the length of the high level duration of the clock CLK based on the duty correction codes DCC_code<0:4>.

Operations of the duty correction unit 300 will be described below with reference to FIG. 2.

The duty correction range setting section 310 determines the delay time in response to the duty correction range control signal DCCrange_ctrl, delays the clock CLK by the determined delay time, and generates the delayed clock CLK_d.

The duty correction operation performance section 320 generates the duty corrected clock CLK_dcc which has the rising edge between the rising edge of the clock CLK and the rising edge of the delayed clock CLK_d, and generates the duty corrected clock CLK_d which has the falling edge between the falling edge of the clock CLK and the falling edge of the delayed clock CLK_d. The duty correction operation performance section 320 operates in such a way as to determine the length of the high level duration of the duty corrected clock CLK_d depending upon the code value of the duty correction codes DCC_code<0:4>.

Operations of extending and reducing the high level duration of the duty corrected clock CLK_d depending upon the code value of the duty correction codes DCC_code<0:4>, will be described below.

It is assumed that the pull-up driving forces and the pull-down driving forces of the first through tenth variable unit driving parts 321-2-1 through 321-2-5 and 322-2-1 through 322-2-5 shown in FIG. 4 have the same configuration to one another.

First, an operation of extending the high level duration of the duty corrected clock CLK_dcc will be described. It is assumed that the code value of the duty correction codes DCC_code<0:4> is '1, 1, 1, 1, 0'.

Figure 6A:
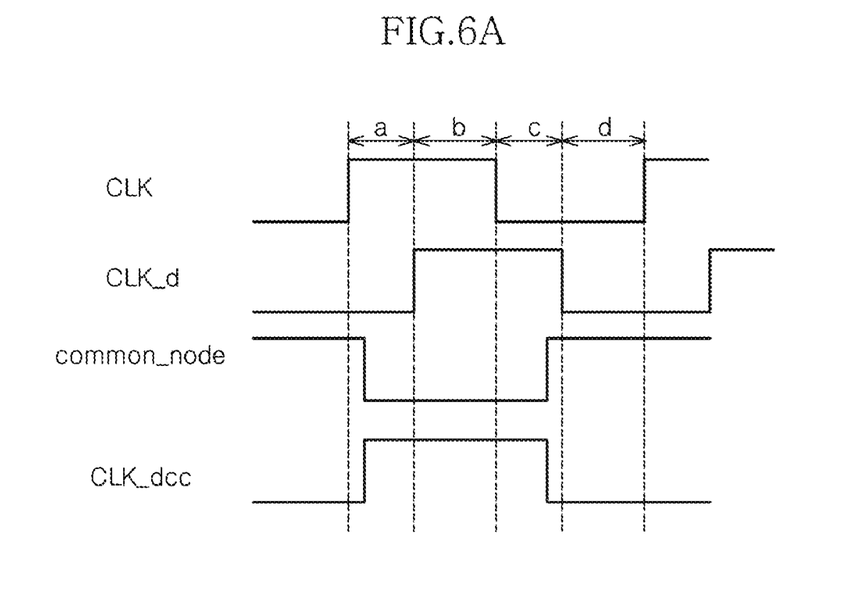
FIG. 6 is a timing diagram explaining operations of the duty cycle correction circuit of a semiconductor memory apparatus in accordance with the embodiment of the present invention.

FIG. 6 is a timing diagram explaining operations of the duty cycle correction circuit of a semiconductor memory apparatus in accordance with the embodiment of the present invention. FIG. 6A shows the clock CLK and the delayed clock CLK_d. There are four periods, that is, a period a in which the clock has the high level and the delayed clock CLK_d has the low level, a period b in which both the clock CLK and the delayed clock CLK_d have the high levels, a period c in which the clock CLK has the low level and the delayed clock CLK_d has the high level, and a period d in which both the clock CLK and the delayed clock CLK_d have the low levels.

Referring to FIG. 4, in the period a, the first common node driving stage 321, which receives the duty correction codes DCC_code<0:4> with the code value of '1, 1, 1, 1, 0' and the clock CLK, pulls down the common node common_node through the four variable unit driving parts, and the second common node driving stage 322 pulls up the common node common_node through one variable unit driving part. Therefore, the voltage level of the common node common_node is lowered at a timing adjacent to the rising edge of the clock CLK.

In the period b, the four variable unit driving parts of the first common node driving stage 321 and the four variable unit is driving parts of the second common node driving stage 322 pull down the common node common_node. Therefore, the voltage level of the common node common_node is kept lowered.

In the period c, one variable unit driving part of the first common node driving stage 321 pulls up the common node common_node, and the four variable unit driving parts of the second common node driving stage 322 pull down the common node common_node. Therefore, the lowered voltage level of the common node common_node is kept till a timing adjacent to the falling edge of the delayed clock CLK_d.

In the period d, one variable unit driving part of the first common node driving stage 321 and one variable unit driving part of the second common node driving part 322 pull up the common node common_node.

Namely, the voltage level of the common node common_node is lowered at the timing adjacent to the rising edge of the clock CLK and is raised at the timing adjacent to the falling edge of the delayed clock CLK_d.

Since the driver 323 inverts and drives the voltage level of the common node common_node and outputs the duty corrected clock CLK_dcc, the duty corrected clock CLK_dcc has a rising edge which is adjacent to the rising edge of the clock CLK between the rising edge of the clock CLK and the rising edge of the delayed clock CLK_d and a falling edge which is adjacent to the falling edge of the delayed clock CLK_d between the falling edge of the clock CLK and the falling edge of the delayed clock CLK_d. As a result, the duty corrected clock CLK_dcc has a high level duration which is extended compared to the high level duration of the clock CLK.

Next, an operation of reducing the high level duration of the duty corrected clock CLK_dcc will be described. It is assumed that the code value of the duty correction codes DCC_code<0:4> is '0, 0, 0, 0, 1'.

Figure 6B:
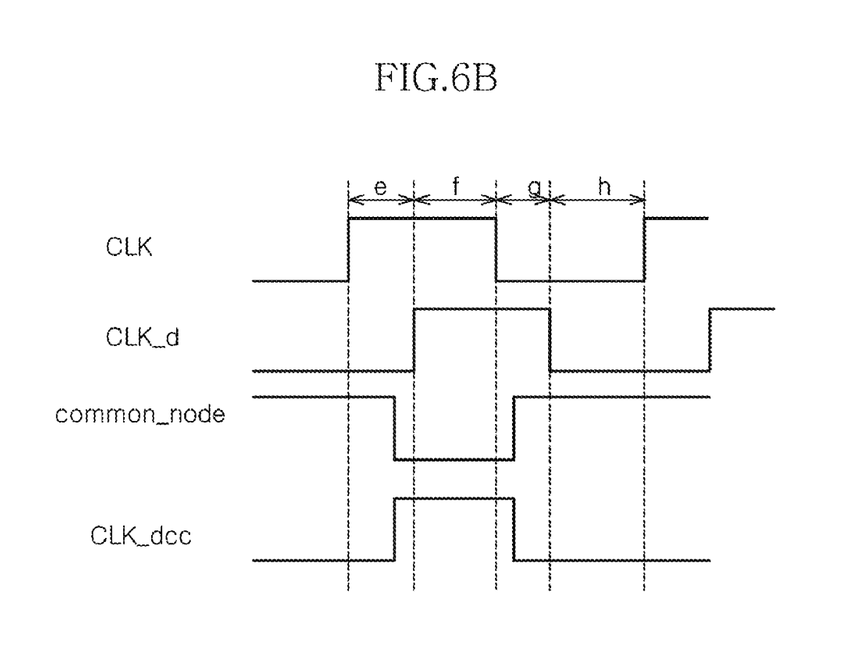

FIG. 6B shows the clock CLK and the delayed clock CLK_d. There are four periods, that is, a period e in which the clock has the high level and the delayed clock CLK_d has the low level, a period f in which both the clock CLK and the delayed clock CLK_d have the high levels, a period g in which the clock CLK has the low level and the delayed clock CLK_d has the high level, and a period h in which both the clock CLK and the delayed clock CLK_d have the low levels.

In the period e, one variable unit driving part of the first common node driving stage 321 performs a pull-down operation, and the four variable unit driving parts of the second common node driving state 322 perform a pull-up operation. The voltage level of the common node common_node maintains the high level till a timing adjacent to the rising edge of the delayed clock CLK_d.

In the period f, one variable unit driving part of the first common node driving stage 321 and one variable unit driving part of the second common node driving stage 322 perform a pull-down operation. The voltage level of the common node common_node is lowered at a timing adjacent to the rising edge of the delayed clock CLK_d.

In the period g, the four variable unit driving parts of the first common node driving stage 321 perform a pull-up operation, and one variable unit driving part of the second common node driving stage 322 performs a pull-down operation. Therefore, the voltage level of the common node common_node is raised at a timing adjacent to the falling edge of the clock CLK.

In the period h, the four variable unit driving parts of the first common node driving stage 321 perform a pull-up operation, and the four variable unit driving parts of the second common node driving stage 322 perform a pull-up operation. Therefore, the raised voltage level of the common node common_node is maintained.

Since the driver 323 inverts and drives the voltage level of the common node common_node and outputs the duty corrected clock CLK_dcc, the duty corrected clock CLK_dcc has a rising edge which is adjacent to the rising edge of the delayed clock CLK_d between the rising edge of the clock CLK and the rising edge of the delayed clock CLK_d and a falling edge which is adjacent to the falling edge of the clock CLK between the falling edge of the clock CLK and the falling edge of the delayed clock CLK_d. As a result, the duty corrected clock CLK_dcc has a high level duration which is reduced compared to the high level duration of the clock CLK.

Because the first common node driving stage 321 and the second common node driving stage 322 constitute a circuit for determining the voltage level of the common node common_node, the first common node driving stage 321 and the second common node driving stage 322 can be collectively referred to as a common node voltage determination section.

As is apparent from the above description, the duty cycle correction circuit of a semiconductor memory apparatus in accordance with the embodiment of the present invention is configured to transfer a pull-up driving force and a pull-down driving force to a common node based on the levels, respectively, of a clock and a delayed clock acquired by delaying the clock, and can change the magnitudes of the pull-up driving force and the pull-down driving force transferred to the common node, based on duty correction codes. Therefore, the rising edge of a clock corrected in the duty thereof, that is, a duty corrected clock occurs between the rising edges of the clock and the delayed clock, and the falling edge of the duty corrected clock occurs between the falling edges of the clock and the delayed clock. Also, based on the duty correction codes, the rising edge of the duty corrected clock may occur adjacent to the rising edge of the clock or the rising edge of the delayed clock, and the falling edge of the duty corrected clock may occur adjacent to the falling edge of the clock or the falling edge of the delayed clock.

Consequently, in the duty cycle correction circuit of a semiconductor memory apparatus in accordance with the embodiment of the present invention, a duty correction range can be set within the phase difference of the clock and the delayed clock, that is, within a delay time by which the clock is delayed to generate the delayed clock, and the high level duration of the duty corrected clock can be increased and decreased depending upon an increase or a decrease in the code value of the duty correction codes as digital codes.

As a result, in the duty cycle correction circuit of a semiconductor memory apparatus in accordance with the embodiment of the present invention, a stable duty correction operation for a high frequency clock through digital operations can be enabled, power consumption for duty correction is reduced, and areal efficiency can be improved.

While certain embodiments have been described above, it will be understood to those skilled in the art that the embodiments described are by way of example only. Accordingly, the duty cycle correction circuit of a semiconductor memory apparatus described herein should not be limited based on the described embodiments. Rather, the duty cycle correction circuit of a semiconductor memory apparatus described herein should only be limited in light of the claims that follow when taken in conjunction with the above description and accompanying drawings.

What is claimed is:

1. A duty cycle correction circuit of a semiconductor memory apparatus, comprising:
    a duty correction unit configured to determine a duty correction range in response to a duty correction range control signal, correct a duty of an inputted clock in response to duty correction codes to fall in the determined duty correction range, and generate a duty corrected clock;
    a duty detection unit configured to detect a duty of the duty corrected clock and output a first duty detection signal; and
    a duty correction code generation unit configured to generate the duty correction codes based on the first duty detection signal.

2. The duty cycle correction circuit according to claim 1, wherein the duty correction unit comprises:
    a duty correction range setting section configured to determine the duty correction range in response to the duty correction range control signal; and
    a duty correction operation performance section configured to correct the duty of the inputted clock to fall in the determined duty correction range based on the duty correction codes and generate the duty corrected clock.

3. The duty cycle correction circuit according to claim 2, wherein the duty correction range setting section determines a delay time in response to the duty correction range control signal, delay the clock by the determined delay time, and generate a delayed clock.

4. The duty cycle correction circuit according to claim 3, wherein the duty correction range setting section comprises:
    a first delay stage configured to delay the clock and generate a first delayed signal;
    a second delay stage configured to delay the first delayed signal and generate a second delayed signal; and
    a selection stage configured to output the first delayed signal or the second delayed signal as the delayed clock in response to the duty correction range control signal.

5. The duty cycle correction circuit according to claim 3, wherein the duty correction operation performance section generates the duty corrected clock which transitions between transition timings of the clock and the delayed clock based on the duty correction codes.

6. The duty cycle correction circuit according to claim 5, wherein the duty correction operation performance section generates the duty corrected clock which has a rising edge between a rising edge of the clock and a rising edge of the delayed clock based on the duty correction codes and a falling edge between a falling edge of the clock and a falling edge of the delayed clock based on the duty correction codes.

7. The duty cycle correction circuit according to claim 5, wherein the duty correction operation performance section comprises:
   a first common node driving stage configured to transfer a first pull-up driving force and a first pull-down driving force for driving a common node based on the duty correction codes and the clock;
   a second common node driving stage configured to transfer a second pull-up driving force and a second pull-down driving force for driving the common node based on the duty correction codes and the delayed clock; and
   a driver configured to drive a voltage of the common node and output the duty corrected clock.

8. The duty cycle correction circuit according to claim 7, wherein the first common node driving stage comprises:
   a fixed driving part configured to drive the common node in response to the clock; and
   a variable driving part configured to drive the common node based on the duty correction codes and the clock.

9. The duty cycle correction circuit according to claim 8, wherein the variable driving part comprises a plurality of variable unit driving parts configured to receive respective bits of the duty correction codes and the clock, and
   wherein respective output terminals of the plurality of variable unit driving parts are coupled to the common node.

10. The duty cycle correction circuit according to claim 9, wherein each of the plurality of variable unit driving parts drives the common node when a level of a bit inputted among the duty correction codes and a level of the clock are the same with each other.

11. The duty cycle correction circuit according to claim 10, wherein each of the plurality of variable unit driving parts transfers the first pull-down driving force to the common node when the bit inputted among the duty correction codes has a high level and the clock has a high level, and transfers the first pull-up driving force to the common node when the bit inputted among the duty correction codes has a low level and the clock has a low level.

12. The duty cycle correction circuit according to claim 7, wherein the second common node driving stage comprises:
   a fixed driving part configured to drive the common node in response to the delayed clock; and
   a variable driving part configured to drive the common node based on the duty correction codes and the delayed clock.

13. The duty cycle correction circuit according to claim 12, wherein the variable driving part comprises a plurality of variable unit driving parts configured to receive the respective bits of the duty correction codes and the delayed clock, and
   wherein respective output terminals of the plurality of variable unit driving parts are coupled to the common node.

14. The duty cycle correction circuit according to claim 13, wherein each of the plurality of variable unit driving parts drives the common node when a level of a bit inputted among the duty correction codes and a level of the delayed clock are the same with each other.

15. The duty cycle correction circuit according to claim 14, wherein each of the plurality of variable unit driving parts transfers the second pull-down driving force to the common node when the bit inputted among the duty correction codes has a high level and the delayed clock has a high level, and transfers the second pull-up driving force to the common node when the bit inputted among the duty correction codes has a low level and the delayed clock has a low level.

16. The duty cycle correction circuit according to claim 1,
   wherein the duty detection unit is further configured to output a second duty detection signal, and
   wherein the duty detection unit enables the first duty detection signal when, between a high level duration and a low level duration of the duty corrected clock, the high level duration is longer than the low level duration, and enables the second duty detection signal when, between the high level duration and the low level duration of the duty corrected clock, the low level duration is longer than the high level duration.

17. The duty cycle correction circuit according to claim 1, wherein the duty correction code generation unit increases or decreases a code value of the duty correction codes based on the duty detection signal.

18. A duty cycle correction circuit of a semiconductor memory apparatus, comprising:
   a duty detection unit configured to detect a duty of a duty corrected clock and enable a first duty detection signal or a second duty detection signal;
   a duty correction code generation unit configured to increase and decrease a code value of duty correction codes in response to the first and second duty detection signals; and
   a duty correction unit configured to generate a delayed clock by delaying a clock, transfer a first pull-up driving force and a first pull-down driving force for determining a voltage level of a common node to the common node in response to the clock and the duty correction codes, transfer a second pull-up driving force and a second pull-down driving force for determining a voltage level of the common node to the common node in response to the delayed clock and the duty correction codes, and generate the duty corrected clock by driving a voltage of the common node.

19. The duty cycle correction circuit according to claim 18, wherein the duty correction unit comprises:
   a duty correction range setting section configured to determine a delay time for delaying the clock in response to a duty correction range control signal, delay the clock by the determined delay time, and generate the delayed clock;
   a first common node driving stage configured to determine magnitudes of the first pull-down driving force and the first pull-up driving force based on the duty correction codes, select the first pull-down driving force or the first pull-up driving force in response to a level of the clock, and transfer the selected driving force to the common node;
   a second common node driving stage configured to determine magnitudes of the second pull-down driving force and the second pull-up driving force based on the duty correction codes, select the second pull-down driving force or the second pull-up driving force in response to a level of the delayed clock, and transfer the selected driving force to the common node; and a driver configured to drive the voltage level of the common node and generate the duty corrected clock.

20. The duty cycle correction circuit according to claim 19, wherein the duty correction range setting section comprises:
a plurality of delay stages coupled in series, and
a selection stage configured to output one of respective output signals of the plurality of delay stages as the delayed clock in response to the duty correction range control signal, and
wherein an initial delay stage among the plurality of delay stages coupled in series receives the clock.

21. The duty cycle correction circuit according to claim 19, wherein the first common node driving stage determines the first is pull-down driving force and the first pull-up driving force based on the duty correction codes, transfers the first pull-down driving force determined in a magnitude thereof to the common node when the level of the clock is a high level, and transfers the first pull-up driving force determined in a magnitude thereof to the common node when the level of the clock is a low level.

22. The duty cycle correction circuit according to claim 21, wherein, in the first common node driving stage, the first pull-up driving force decreases when the first pull-down driving force increases based on the code value of the duty correction codes, and increases when the first pull-down driving force decreases based on the code value of the duty correction codes.

23. The duty cycle correction circuit according to claim 22, wherein the first common node driving stage comprises a plurality of variable unit driving parts configured to receive respective bits of the duty correction codes and the clock, and
wherein respective output terminals of the plurality of variable unit driving parts are coupled to the common node.

24. The duty cycle correction circuit according to claim 23, wherein each of the plurality of variable unit driving parts comprises:
a pull-down driving element configured to pull down the common node when the clock has the high level and a level of a bit inputted among the duty correction codes has a high level; and
a pull-up driving element configured to pull up the common node when the clock has the low level and the level of the bit inputted among the duty correction codes has a low level.

25. The duty cycle correction circuit according to claim 24, wherein the pull-down driving element and the pull-up driving element commonly receive one bit of the duty correction codes.

26. The duty cycle correction circuit according to claim 19, wherein the second common node driving stage determines the second pull-down driving force and the second pull-up driving force based on the duty correction codes, transfers the second pull-down driving force determined in a magnitude thereof to the common node when the level of the delayed clock is a high level, and transfers the second pull-up driving force determined in a magnitude thereof to the common node when the level of the delayed clock is a low level.

27. The duty cycle correction circuit according to claim 26, wherein, in the second common node driving stage, the second pull-up driving force decreases when the second pull-down driving force increases based on the code value of the duty correction codes, and increases when the second pull-down driving force decreases based on the code value of the duty correction codes.

28. The duty cycle correction circuit according to claim 27, wherein the second common node driving stage comprises a plurality of variable unit driving parts configured to receive respective bits of the duty correction codes and the delayed clock, and
wherein respective output terminals of the plurality of variable unit driving parts are coupled to the common node.

29. The duty cycle correction circuit according to claim 28, wherein each of the plurality of variable unit driving parts comprises:
a pull-down driving element configured to pull down the common node when the clock has the high level and a level of a bit inputted among the duty correction codes has a high level; and
a pull-up driving element configured to pull up the common node when the clock has the low level and the level of the bit inputted among the duty correction codes has a low level.

30. The duty cycle correction circuit according to claim 29, wherein the pull-down driving element and the pull-up driving element commonly receive one bit of the duty correction codes.

31. A duty cycle correction circuit of a semiconductor memory apparatus, comprising:
a duty correction range setting section configured to delay a clock and generate a delayed clock;
a common node voltage determination section configured to determine a voltage level of a common node in response to one of a pull-up driving force and a pull-down driving force when phases of the clock and the delayed clock are the same with each other, and determine the voltage level of the common node in response to both the pull-up driving force and the pull-down driving force according to duty correction codes when the phases of the clock and the delayed clock are different from each other; and
a driver configured to drive the voltage level of the common node and output a duty corrected clock.

32. The duty cycle correction circuit according to claim 31, wherein the duty correction range setting section delays the clock by a delay time determined in response to a duty correction range control signal and generate the delayed clock.

33. The duty cycle correction circuit according to claim 31, wherein the common node voltage determination section comprises:
a first common node driving stage configured to transfer a first pull-down driving force or a first pull-up driving force to the common node in response to a level of the clock, and determine magnitudes of the first pull-down driving force and the first pull-up driving force based on the duty correction codes; and
a second common node driving stage configured to transfer a second pull-down driving force or a second pull-up driving force to the common node in response to a level of the delayed clock, and determine magnitudes of the second pull-down driving force and the second pull-up driving force based on the duty correction codes.

34. The duty cycle correction circuit according to claim 33, wherein, when the clock has a high level, the first common node driving stage selects the first pull-down driving force, determines the magnitude of the first pull-down driving force based on a code value of the duty correction codes, and transfers the first pull-down driving force determined in the magnitude thereof to the common node, and
wherein, when the clock has a low level, the first common node driving stage selects the first pull-up driving force, determines the magnitude of the first pull-up driving force based on the code value of the duty correction codes, and transfers the first pull-up driving force determined in the magnitude thereof to the common node.

35. The duty cycle correction circuit according to claim 34, wherein, in the first common node driving stage, the first pull-up driving force decreases when the first pull-down driving force increases based on the code value of the duty correction codes, and increases when the first pull-down driving force decreases based on the code value of the duty correction codes.

36. The duty cycle correction circuit according to claim 35, wherein the first common node driving stage comprises a plurality of variable unit driving parts configured to receive respective bits of the duty correction codes and the clock, and
wherein respective output terminals of the plurality of variable unit driving parts are coupled to the common node.

37. The duty cycle correction circuit according to claim 36, wherein each of the plurality of variable unit driving parts comprises:
a pull-down driving element configured to pull down the common node when the clock has the high level and a level of a bit inputted among the duty correction codes has a high level; and
a pull-up driving element configured to pull up the common node when the clock has the low level and the level of the bit inputted among the duty correction codes has a low level.

38. The duty cycle correction circuit according to claim 37, wherein the pull-down driving element and the pull-up driving element commonly receive one bit of the duty correction codes.

39. The duty cycle correction circuit according to claim 31, wherein, when the delayed clock has a high level, the second common node driving stage selects the second pull-down driving force, determines the magnitude of the second pull-down driving force based on a code value of the duty correction codes, and transfers the second pull-down driving force determined in the magnitude thereof to the common node, and
wherein, when the delayed clock has a low level, the second common node driving stage selects the second pull-up driving force, determines the magnitude of the second pull-up driving force based on the code value of the duty correction codes, and transfers the second pull-up driving force determined in the magnitude thereof to the common node.

40. The duty cycle correction circuit according to claim 39, wherein, in the second common node driving stage, the second pull-up driving force decreases when the second pull-down driving force increases based on the code value of the duty correction codes, and increases when the second pull-down driving force decreases based on the code value of the duty correction codes.

41. The duty cycle correction circuit according to claim 40, wherein the second common node driving stage comprises a plurality of variable unit driving parts configured to receive respective bits of the duty correction codes and the delayed clock, and
wherein respective output terminals of the plurality of variable unit driving parts are coupled to the common node.

42. The duty cycle correction circuit according to claim 41, wherein each of the plurality of variable unit driving parts comprises:
a pull-down driving element configured to pull down the common node when the clock has the high level and a level of a bit inputted among the duty correction codes has a high level; and
a pull-up driving element configured to pull up the common node when the clock has the low level and the level of the bit inputted among the duty correction codes has a low level.

43. The duty cycle correction circuit according to claim 42, wherein the pull-down driving element and the pull-up driving element commonly receive one bit of the duty correction codes.

\* \* \* \* \*